(12) United States Patent
Hirata et al.

(10) Patent No.: US 8,476,606 B2
(45) Date of Patent: Jul. 2, 2013

(54) DRAWING APPARATUS AND METHOD OF MANUFACTURING ARTICLE

(75) Inventors: Yoshihiro Hirata, Utsunomiya (JP); Toru Yamazaki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 73 days.

(21) Appl. No.: 13/184,066

(22) Filed: Jul. 15, 2011

(65) Prior Publication Data
US 2012/0015303 A1    Jan. 19, 2012

(30) Foreign Application Priority Data
Jul. 16, 2010    (JP) ................................. 2010-162218

(51) Int. Cl.
*G03F 7/20* (2006.01)

(52) U.S. Cl.
USPC ............... 250/492.22; 250/396 R; 250/492.1; 250/492.2; 250/492.3

(58) Field of Classification Search
USPC ................ 250/396 R, 396 ML, 492.1, 492.2, 250/492.22, 492.23, 492.3
See application file for complete search history.

(56) References Cited

U.S. PATENT DOCUMENTS 4,827,137 A * 5/1989 Collins et al. .............. 250/492.2
6,483,120 B1 * 11/2002 Yui et al. .................... 250/491.1

FOREIGN PATENT DOCUMENTS

JP          09-007538 A      1/1997

* cited by examiner

*Primary Examiner* — Michael Logie
(74) *Attorney, Agent, or Firm* — Rossi, Kimms & McDowell LLP (57) ABSTRACT

A drawing apparatus for drawing a pattern on a substrate with a plurality of charged-particle beams, includes a blanking aperture array including a plurality of apertures, a blanking unit including a plurality of blankers and configured to respectively deflect the plurality of charged-particle beams by the plurality of blankers to cause the blanking aperture array to block the respectively deflected plurality of charged-particle beams, a generating circuit configured to generate a blanking instruction in a serial format, and a serial transmission cable configured to transmit the blanking instruction generated by the generating circuit to the blanking unit, wherein the blanking unit is configured to convert the blanking instruction in the serial format, that has been received via the serial transmission cable, into a blanking instruction in a parallel format, and to drive the plurality of blankers based on the blanking instruction in the parallel format.

20 Claims, 6 Drawing Sheets

DRAWING APPARATUS AND METHOD OF MANUFACTURING ARTICLE

BACKGROUND OF THE INVENTION

1. Field of the Invention

The present invention relates to a drawing apparatus for drawing a pattern on a substrate with a plurality of charged-particle beams, and a method of manufacturing an article using the same.

2. Description of the Related Art

A charged-particle beam drawing apparatus which draws a pattern on a substrate using a charged-particle beam such as an electron beam is available. An improvement in drawing speed is the most serious challenge for the charged-particle beam drawing apparatus. As a scheme for improving the drawing speed, a multi-charged-particle beam scheme in which a charged-particle beam emitted by a charged-particle source is divided into a plurality of charged-particle beams to simultaneously draw a pattern on a substrate using the plurality of charged-particle beams is advantageous.

A charged-particle beam drawing apparatus which draws a pattern on a substrate with a plurality of charged-particle beams poses a problem where the number of driving signal lines used to control blankers (blanking deflectors) which control charged-particle beam irradiation/non-irradiation of the substrate increases with an increase in number of charged-particle beams. A barrel which accommodates a blanker array in which a plurality of blankers are arrayed, and an electric component including a plurality of drivers corresponding to the plurality of blankers, respectively, are connected to each other via a plurality of driving signal lines. The drivers must have a driving capacity which takes into consideration the parasitic capacitance and parasitic resistance of the driving signal lines, so the size of the electric component may increase. Also, the number of driving signal lines increases in proportion to the number of blankers, so the cable which bundles the driving signal lines gets thicker in proportion to the number of blankers as well. When the cable gets thick, vibration may be transmitted from the electric component to the barrel via the cable, so a measure against it becomes necessary. In this manner, various constraints may be imposed on a scheme in which an electric component is arranged at a position spaced apart from a barrel, and blankers and drivers are connected to each other via individual driving signal lines.

SUMMARY OF THE INVENTION

The present invention has been made in recognition of the above-mentioned background, and has as its object to provide a technique that is advantageous in terms of throughput and implementation for a drawing apparatus including a plurality of blankers.

One of the aspects of the present invention provides a drawing apparatus for drawing a pattern on a substrate with a plurality of charged-particle beams, the apparatus comprising a blanking aperture array including a plurality of apertures, a blanking unit including a plurality of blankers and configured to respectively deflect the plurality of charged-particle beams by the plurality of blankers to cause the blanking aperture array to block the respectively deflected plurality of charged-particle beams, a generating circuit configured to generate a blanking instruction in a serial format; and a serial transmission cable configured to transmit the blanking instruction generated by the generating circuit to the blanking unit, wherein the blanking unit is configured to convert the blanking instruction in the serial format, that has been received via the serial transmission cable, into a blanking instruction in a parallel format, and to drive the plurality of blankers based on the blanking instruction in the parallel format.

Further features of the present invention will become apparent from the following description of exemplary embodiments with reference to the attached drawings.

DESCRIPTION OF THE EMBODIMENTS

Embodiments of the present invention will be described below with reference to the accompanying drawings. A charged-particle beam drawing apparatus according to an embodiment of the present invention will be described first with reference to FIG. 1. Although an example in which an electron beam is used as a charged-particle beam will be explained herein, the charged-particle beam may be, for example, an ion beam.

Figure 1:
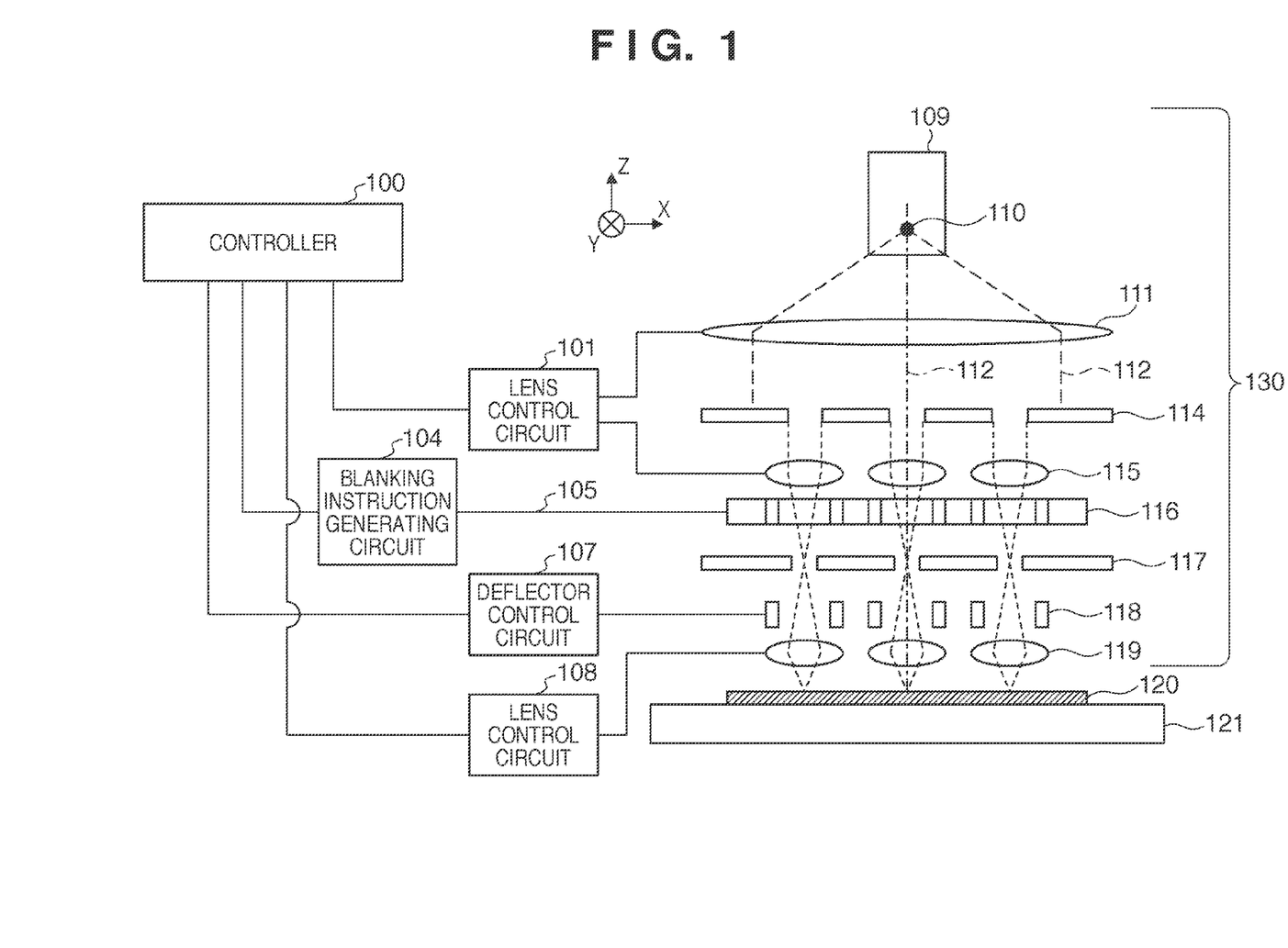
FIG. 1 is a diagram showing the schematic configuration of a charged-particle beam drawing apparatus according to an embodiment of the present invention.

The charged-particle beam drawing apparatus includes a positioning mechanism (stage mechanism) 121 which positions a substrate 120 coated with a photosensitive agent, and a barrel 130 which irradiates the substrate 120 with an electron beam to draw a pattern on the substrate 120. The charged-particle beam drawing apparatus can also include a controller 100, lens control circuits 101 and 108, blanking instruction generating circuit 104, and deflector control circuit 107.

The barrel 130 can include, for example, an electron gun 109, collimator lens 111, aperture array 114, blanking unit 116, blanking aperture array 117, deflectors 118, and electro-static lenses 119. The electron gun (charged-particle source) 109 forms a crossover image 110, which generates electrons. The electrons emitted from the crossover image 110 form a collimated electron beam by the action of the collimator lens 111 that uses an electromagnetic lens. The electron beam enters the aperture array 114. Referring to FIG. 1, reference numeral 112 exemplifies the electron trajectory.

The aperture array 114 includes a plurality of circular apertures (openings) arrayed in a matrix pattern, and the electron beam incident on the aperture array 114 is divided into a plurality of electron beams by the aperture array 114. The electron beams having passed through the apertures of the aperture array 114 enter electro-static lenses 115 arrayed in a matrix pattern. The electro-static lenses 115 can use, for example, three electrode plates having circular apertures.

The blanking aperture array 117 is arranged on the focal planes of the electro-static lenses 115. In the blanking aperture array 117, a plurality of blanking apertures are arrayed in a matrix pattern in correspondence with the plurality of electro-static lenses 115. The blanking unit 116 in which a plurality of blankers are arrayed in a matrix pattern is arranged between the electro-static lenses 115 and the blanking aperture array 117. Each blanker includes a pair of blanking electrodes which face each other while an aperture formed in a supporting substrate which supports it is sandwiched between them. If no potential difference is generated between the pair of blanking electrodes, the electron beam passes through the blanking aperture of the blanking aperture array 117 and strikes the substrate 120. On the other hand, if a predetermined potential difference is generated between the pair of blanking electrodes, the electron beam is deflected and blocked by the blanking aperture array 117 and therefore neither passes the blanking aperture nor strikes the substrate 120. That is, the blanking unit 116 controls the plurality of blankers so that an electron beam with which the substrate 120 is to be irradiated passes through the blanking aperture, while an electron beam with which the substrate 120 is not to be irradiated is blocked by the blanking aperture array 117. The blanking unit 116 controls the electron beam blanking (electron beam irradiation/non-irradiation of the substrate 120) in accordance with a blanking instruction issued by the blanking instruction generating circuit 104 via a serial transmission cable 105.

The electron beam having passed through the blanking aperture array 117 forms an image on the surface of the substrate 120 by means of the electro-static lenses 119. During drawing of a pattern on the substrate 120, the substrate 120 is continuously driven in the X direction by the positioning mechanism 121, so the electron beam is scanned in the Y direction by the deflectors 118 and undergoes control of irradiation/non-irradiation of the substrate 120 by the blanking unit 116.

The controller 100, for example, receives data of a pattern to be drawn on the substrate 120 from a device (not shown), converts it into bitmap data, and provides the converted data to the blanking instruction generating circuit 104. The blanking instruction generating circuit 104 generates a plurality of blanking instructions for controlling a plurality of blankers 207, based on the bitmap data provided by the controller 100. The lens control circuit 101 controls the collimator lens 111 and electro-static lenses 115. The lens control circuit 108 controls the electro-static lenses 119. The deflector control circuit 107 controls the deflectors 118.

Figure 2:
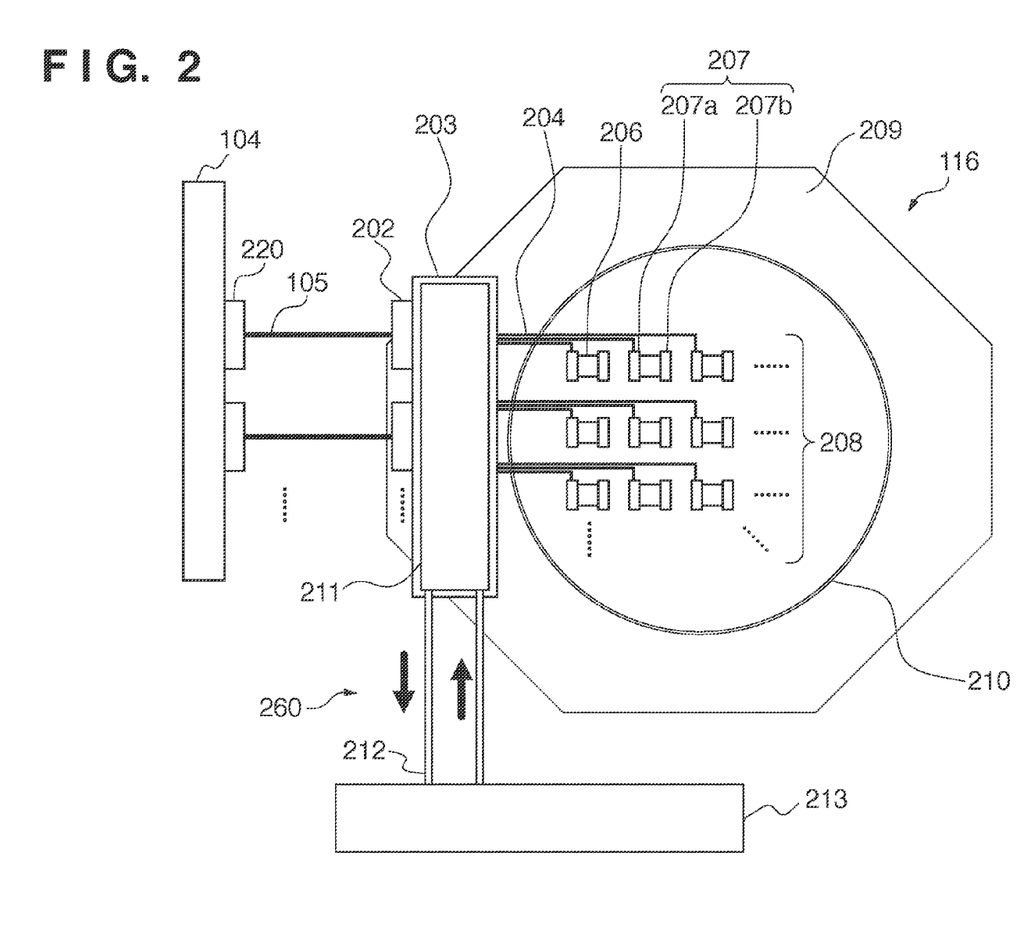
FIG. 2 is a schematic plan view illustrating an example of the arrangement of a blanking unit and its associated portion.
Figure 3:
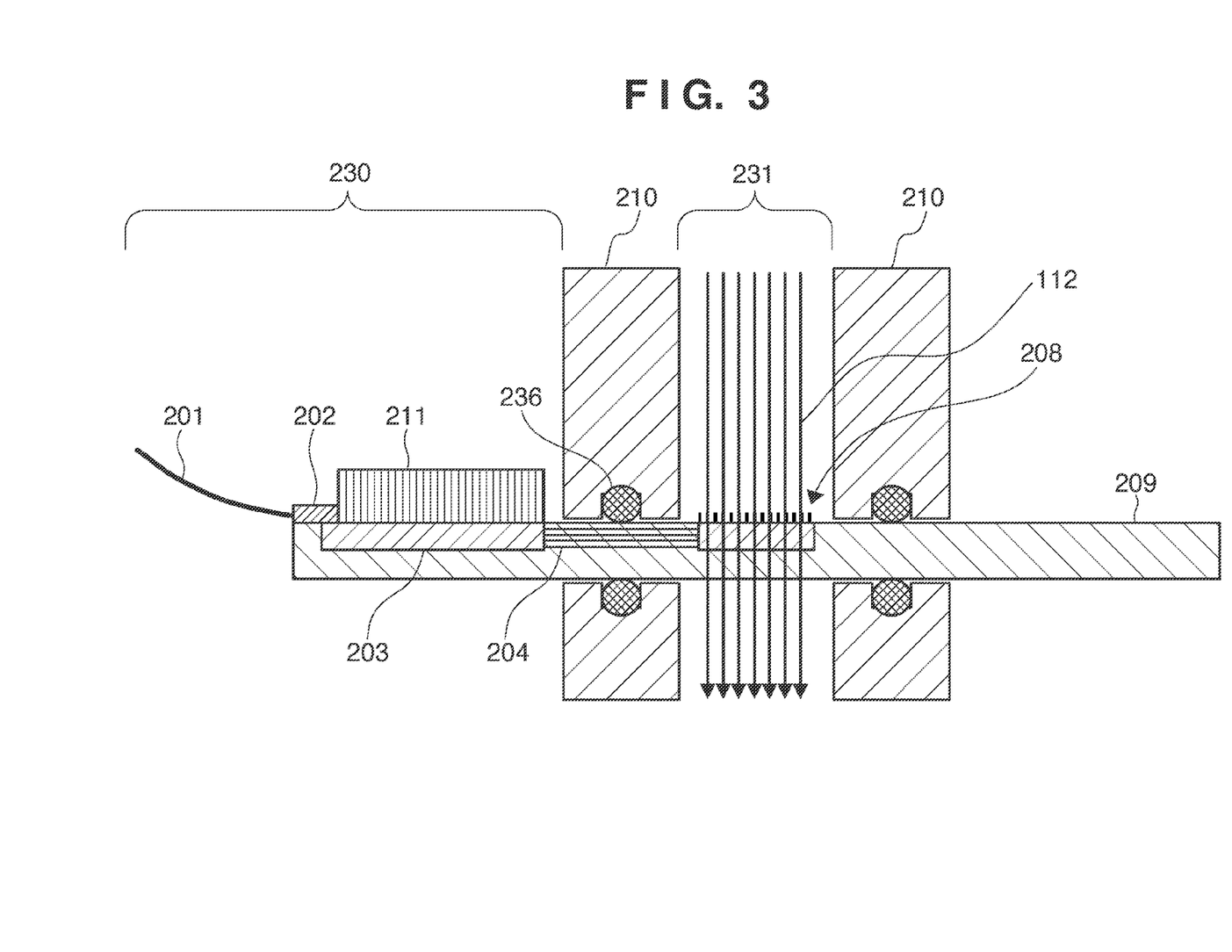
FIG. 3 is a schematic sectional view illustrating an example of the arrangement of the blanking unit and its associated portion.

An example of the arrangement of the blanking unit 116 and its associated portion will be described with reference to FIGS. 2 and 3. The blanking unit 116 includes, for example, a supporting substrate 209, blanker array 208, and blanking control circuit 203. A plurality of apertures 206 are arrayed in the supporting substrate 209 in a matrix pattern. The blanker array 208 is formed by arraying the plurality of blankers 207 corresponding to the plurality of apertures 206, respectively, in a matrix pattern. The blanking control circuit 203 is arranged on the supporting substrate 209, and controls the plurality of blankers 207 via driving signal lines 204. The blanker 207 serves as a deflector which deflects the electron beam, and includes a pair of blanking electrodes 207a and 207b which face each other while the aperture 206 formed in the supporting substrate 209 is sandwiched between them.

The supporting substrate 209 extends from an inner space 231 of a barrel housing 210 which surrounds the plurality of blankers 207 to an outer space 230 of the barrel housing 210. The blanker array 208 is arranged in the inner space 231 of the barrel housing 210. The inner space 231 and the outer space 230 can be separated from each other by seals 236. The blanking control circuit 203 can be arranged wholly or partly in, for example, the outer space 230 of the barrel housing 210. The blanking control circuit 203 receives a blanking instruction in the serial data format via the serial transmission cable 105 from the blanking instruction generating circuit 104 arranged at a position spaced apart from the barrel 130. The blanking instruction can include, for example, dot data indicating electron beam irradiation/non-irradiation, and timing data indicating the timing of irradiation/non-irradiation switching (that is, blanking), for each of the plurality of blankers 207.

The serial transmission cable 105 connects an interface 220 provided on the blanking instruction generating circuit 104 and an interface 202 provided on the blanking unit 116. The interfaces 220 and 202 can be serial interfaces. The serial transmission cable 105 can be an optical fiber cable. The blanking control circuit 203 generates a plurality of driving signals used to control the plurality of blankers 207, based on the blanking instruction received from the blanking instruction generating circuit 104, and outputs them to the plurality of driving signal lines 204, respectively. The blanking control circuit 203 of the blanking unit 116 can be cooled wholly or partly by a cooling device 260. The cooling device 260 can include a heat exchanger 211 which recovers heat wholly or partly from the blanking control circuit 203, a conduit 212 which forms a circulation path that passes through the heat exchanger 211, and a cooler which cools a refrigerant that passes through the heat exchanger 211.

Figure 4:
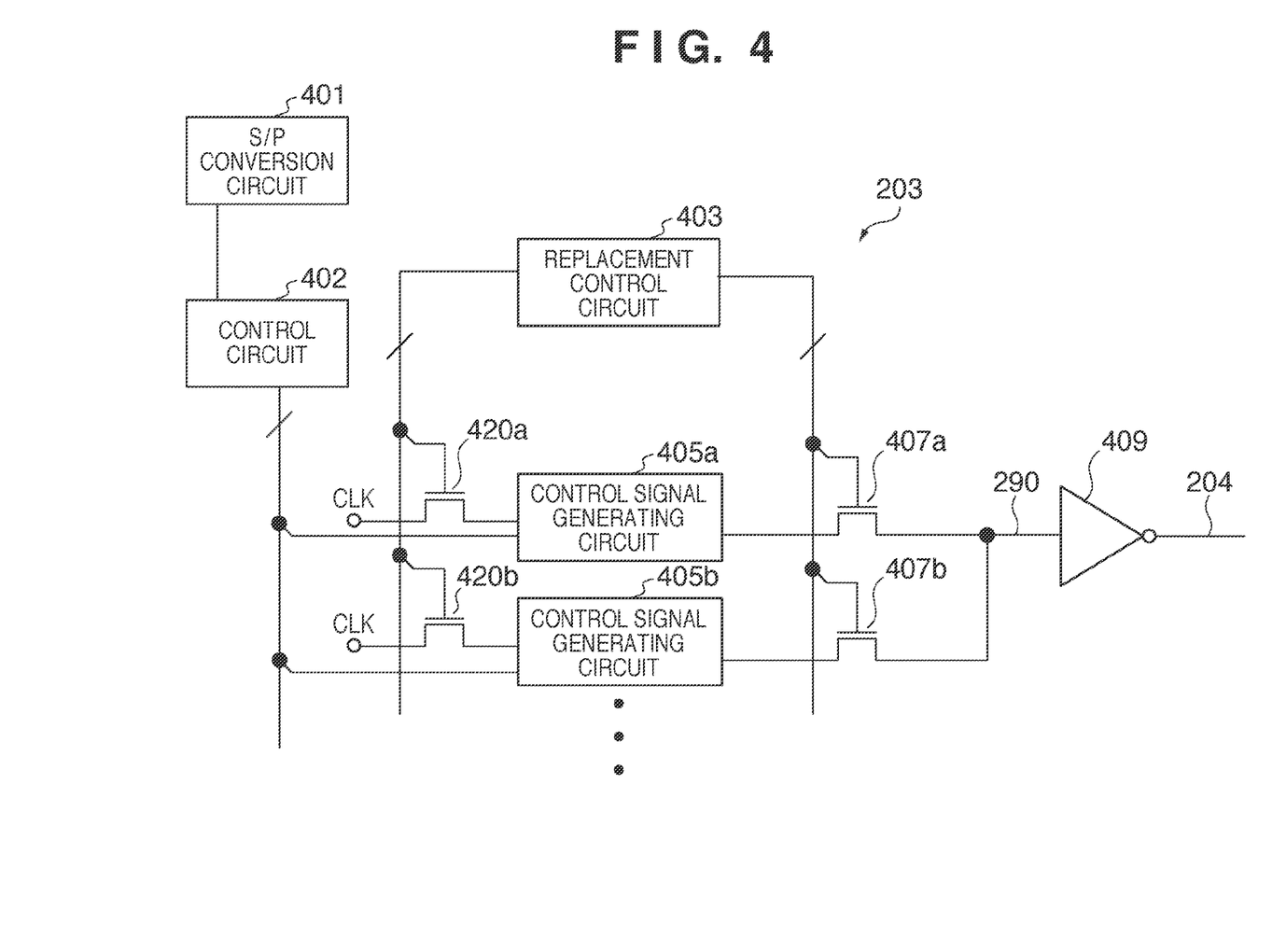
FIG. 4 is a circuit diagram illustrating an example of the configuration of a blanking control circuit.

An example of the configuration of the blanking control circuit 203 will be described with reference to FIG. 4. The blanking control circuit 203 can include a serial-parallel conversion circuit (S/P conversion circuit) 401, a control circuit 402, a plurality of control signal generating circuits 405a, and a plurality of drivers 409. The serial-parallel conversion circuit 401 converts serial data of the blanking instruction received from the blanking instruction generating circuit 104 by the interface 202 into parallel data. The plurality of control signal generating circuits 405a correspond to the plurality of blankers 207, respectively. Each control signal generating circuit 405a generates a control signal for its corresponding blanker 207. The control signal is supplied to the driver 409 via a signal line 290, and the driver 409 drives the blanker 207 in accordance with the control signal. The driver 409 can include a push-pull circuit such as a CMOS inverter. By adopting a push-pull circuit, charges remaining on the blanking electrodes can be quickly removed upon switching the blanker 207 from an ON state to an OFF state, thus making it possible to speed up switching from an ON state to an OFF state. The control circuit 402 generates dot data and timing data based on the blanking instruction converted into parallel data by the serial-parallel conversion circuit 401, and supplies them to the plurality of control signal generating circuits 405a.

Note that the scale of the blanking control circuit 203 increases with an increase in number of blankers 207, and the possibility that a defect is produced during the manufacture of the blanking control circuit 203 increases accordingly. Hence, the blanking control circuit 203 preferably includes a redundant circuit to replace a circuit which suffers from a defect with the redundant circuit upon the occurrence of the defect. In an example shown in FIG. 4, the blanking control circuit 203 is provided with a control signal generating circuit 405b used in place of the control signal generating circuit 405a if it has a defect. The blanking control circuit 203 can include a replacement control circuit 403. The replacement control circuit 403 replaces a circuit (for example, the control signal generating circuit 405a) having a defect with a redundant circuit (for example, the control signal generating circuit 405b) based on information which specifies the circuit having a defect. This information can be stored in an internal or external memory of the replacement control circuit 403. This information may be provided by the blanking instruction generating circuit 104 or controller 100. A case in which the control signal generating circuit 405a, for example, has a defect will be considered. In this case, the replacement control circuit 403 can turn off a switch 407a arranged between the control signal generating circuit 405a and the driver 409, and turn on a switch 407b arranged between the control signal generating circuit 405b serving as a redundant circuit and the driver 409. Fuses may be adopted in place of the switches 407a and 407b. In such a configuration, if the control signal generating circuit 405a has a defect, the fuse arranged between the control signal generating circuit 405b and the driver 409 is disconnected. However, if the control signal generating circuit 405b has a defect, the fuse arranged between the control signal generating circuit 405a and the driver 409 is disconnected. If neither the control signal generating circuit 405a nor 405b has a defect, one of the two fuses is disconnected.

The replacement control circuit 403 preferably stops the supply of the clock signal CLK, the power supply voltage or both in order to a control signal generating circuit having a defect. FIG. 4 illustrates a configuration which stops the supply of the clock signal CLK to a control signal generating circuit having a defect. A case in which the control signal generating circuit 405a, for example, has a defect will be considered. In this case, the replacement control circuit 403 turns off a switch 420a to stop the supply of the clock signal CLK to the control signal generating circuit 405a having a defect. Also, the replacement control circuit 403 turns on a switch 420b to supply the clock signal CLK to the control signal generating circuit 405b serving as a redundant circuit.

Figure 5:
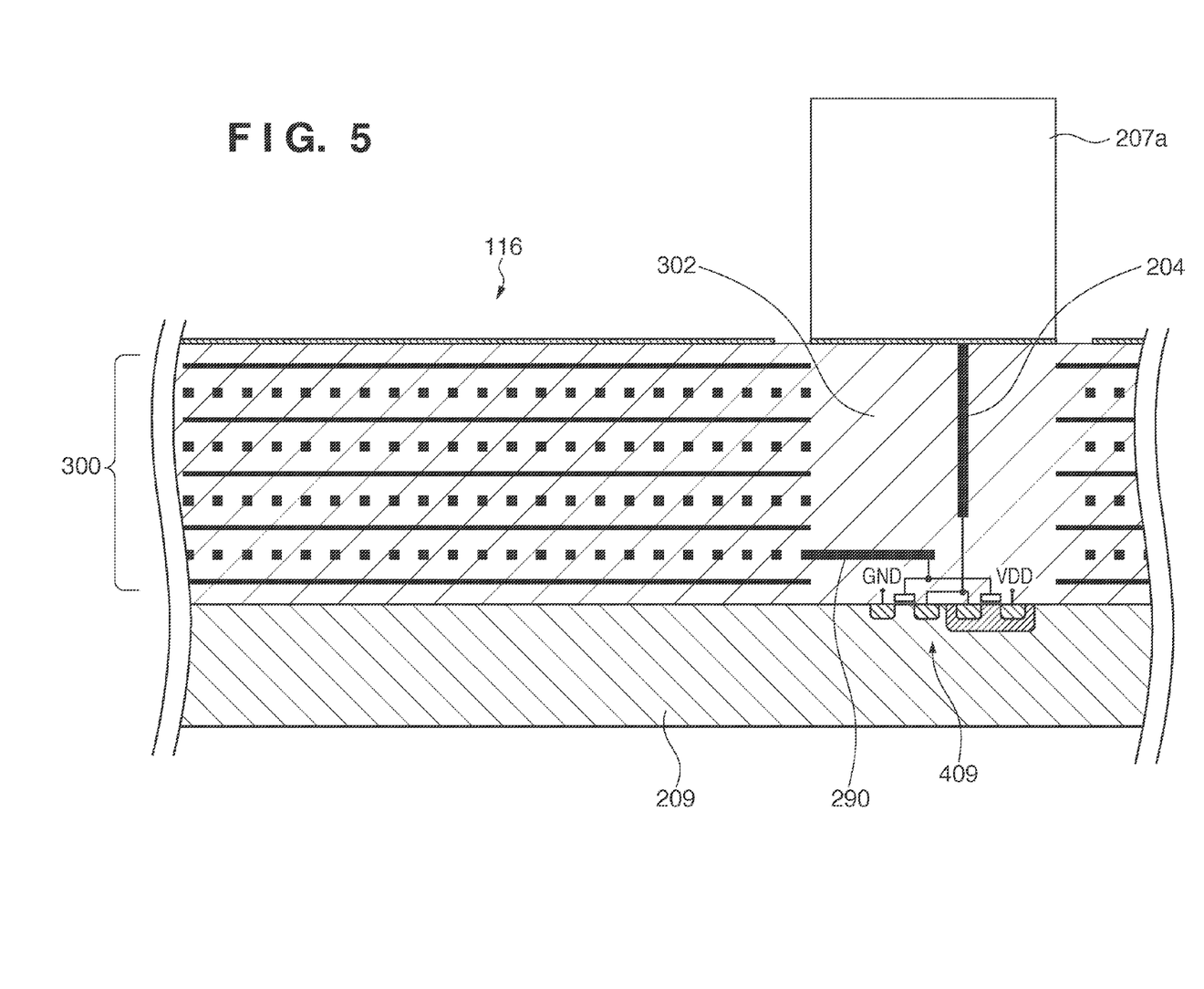
FIG. 5 is a schematic sectional view illustrating an example of the arrangement of the blanking unit.

An example of the arrangement of the blanking unit 116 will be described with reference to FIG. 5. One blanking electrode 207a that constitutes the blanker 207 can be connected to the driving signal line 204, and its other blanking electrode 207b (hidden behind the blanking electrode 207a in FIG. 5) can be connected to a line maintained at a fixed potential, such as a grounding conductor. The driver 409 which can include a push-pull circuit (for example, a CMOS inverter) can be wholly or partly arranged under the blanking electrode 207a. With such an arrangement, the wiring length of the driving signal line 204 can be shortened, thus speeding up turn-on/off of the blanker 207. The supporting substrate 209 can use a semiconductor substrate or both a semiconductor substrate and another substrate, and the driver 409 can be formed on the semiconductor substrate. A stacked structure of a wiring layer and an interlayer insulation film can be arranged on the semiconductor substrate. The serial-parallel conversion circuit (S/P conversion circuit) 401, control circuit 402, control signal generating circuits 405a and 405b, and switches 407a and 407b can also be formed on the semiconductor substrate. In an example shown in FIG. 5, the serial-parallel conversion circuit 401, control circuit 402, control signal generating circuits 405a and 405b, and switches 407a and 407b are arranged in the outer space of the barrel housing 210, and the driver 409 is arranged in its inner space.

As described above, in this embodiment, the blanking unit 116 built into the barrel 130, and the blanking instruction generating circuit 104 arranged at a position spaced apart from the barrel 130 are connected to each other via the serial transmission cable 105. A blanking instruction generated by the blanking instruction generating circuit 104 is transmitted to the blanking unit 116 via the serial transmission cable 105. This makes it possible to simplify the configuration which connects the barrel 130 and the blanking instruction generating circuit 104 to each other, and to downsize the blanking instruction generating circuit 104. Also, because the thickness of the serial transmission cable 105 can be decreased, vibration transmitted from the blanking instruction generating circuit 104 to the barrel 130 can be reduced.

Redundancy generation may be done not only by building a redundant circuit into the blanking control circuit 203, as described above, but also by, for example, building at least two blanking units 116 into the barrel 130 in series along the path of the electron beam (charged-particle beam). In an example shown in FIG. 6, two-stage blanking units 116a and 116b are provided as at least two blanking units 116. Accordingly, electro-static lenses 115a and 115b are provided in place of the electro-static lenses 115, and blanking aperture arrays 117a and 117b are provided in place of the blanking aperture array 117.

Figure 6:
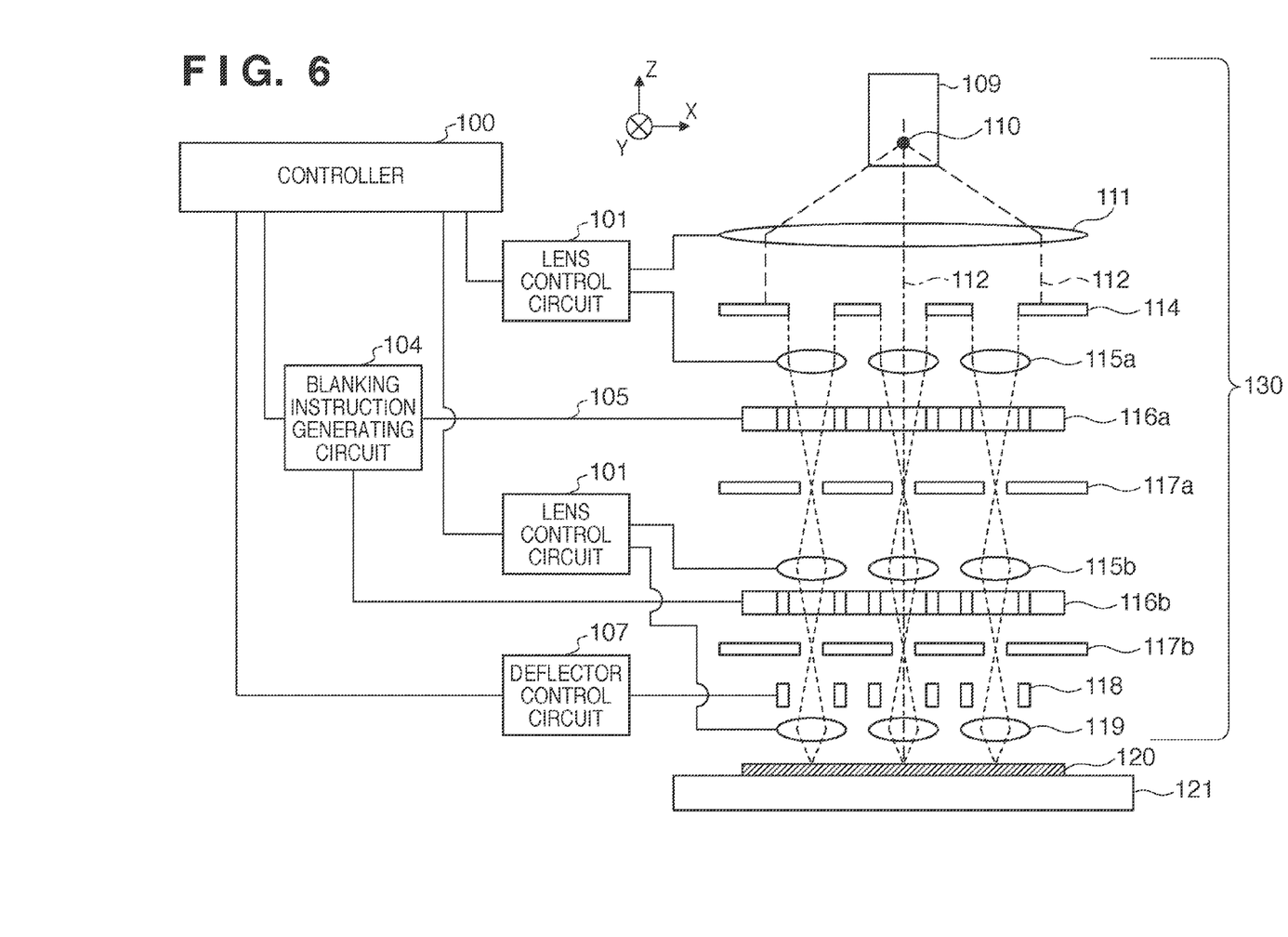
FIG. 6 is a diagram showing the schematic configuration of a charged-particle beam drawing apparatus according to another embodiment of the present invention.

The structure of wiring in the vicinity of the barrel 130 can be simplified by connecting the blanking units 116a and 116b and the blanking instruction generating circuit 104 to each other via the serial transmission cable 105, thus facilitating the arrangement of two or more blanking units 116a and 116b. In such a configuration, when one blanker of the blanking unit 116a or a circuit which drives it, for example, has a defect, a blanker of the blanking unit 116b corresponding to it can be used instead.

A method of manufacturing an article according to the present invention is suitable for manufacturing a microdevice such as a semiconductor device. The manufacturing method can include a step of drawing a pattern on a substrate, coated with a photosensitive agent, using the above-mentioned charged-particle beam drawing apparatus, and a step of developing the substrate having the pattern drawn on it in the drawing step. The manufacturing method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-162218, filed Jul. 16, 2010, which is hereby incorporated by reference herein in its entirety.

What is claimed is:

1. A drawing apparatus for drawing a pattern on a substrate with a plurality of charged-particle beams, the apparatus comprising:
 a blanking aperture array including a plurality of apertures;
 a blanking unit including a plurality of blankers and configured to respectively deflect the plurality of charged-particle beams by the plurality of blankers to cause the blanking aperture array to block the respectively deflected plurality of charged-particle beams;
 a generating circuit configured to generate a blanking instruction in a serial format; and
 a serial transmission cable configured to transmit the blanking instruction generated by the generating circuit to the blanking unit,
 wherein the blanking unit is configured to convert the blanking instruction in the serial format, that has been received via the serial transmission cable, into a blanking instruction in a parallel format, and to drive the plurality of blankers based on the blanking instruction in the parallel format.

2. The apparatus according to claim 1, wherein the blanking unit includes a redundant circuit with which an element circuit thereof is replaced.

3. The apparatus according to claim 2, wherein the blanking unit further includes a replacement control circuit configured to replace the element circuit with the redundant circuit.

4. The apparatus according to claim 1, wherein the apparatus comprises at least two of the blanking unit arranged in series along paths of the plurality of charged-particle beams, wherein if a blanker in one of the at least two has a defect, a blanker in another of the at least two is used in place of the blanker having the defect.

5. The apparatus according to claim 1, wherein the blanking unit includes
a supporting substrate including a plurality of drivers configured to drive the plurality of blankers, respectively, and
blanking electrodes driven by the plurality of drivers, respectively,
the supporting substrate includes
a semiconductor substrate on which the plurality of drivers are formed, and
a stacked structure, arranged on the semiconductor substrate, of wiring layers and an interlayer insulation film therebetween,
the blanking electrodes are arranged on the stacked structure, and
at least a part of each of the plurality of drivers is arranged under corresponding one of the blanking electrodes.

6. The apparatus according to claim 5, wherein each of the plurality of drivers includes a push-pull circuit.

7. The apparatus according to claim 6, wherein the push-pull circuit includes a CMOS inverter.

8. The apparatus according to claim 5, further comprising a housing surrounding the plurality of blankers, wherein the blanking unit includes a plurality of control signal generating circuits configured to supply control signals to the plurality of drivers, respectively, the supporting substrate extends from an inner space inside of the housing to an outer space outside of the housing, and the plurality of control signal generating circuits are arranged on the supporting substrate in the outer space.

9. The apparatus according to claim 1, wherein
the blanking unit includes a blanking control circuit configured to generate a plurality of driving signals to control the plurality of blankers, respectively, based on the blanking instruction in the parallel format, and
the apparatus further comprises a cooling device configured to cool the blanking control circuit.

10. A method of manufacturing an article, the method comprising:
drawing a pattern on a substrate using a drawing apparatus;
developing the substrate on which the pattern has been drawn; and
processing the developed substrate to manufacture the article,
wherein the drawing apparatus is configured to draw a pattern on the substrate with a plurality of charged-particle beams and comprises:
a blanking aperture array including a plurality of apertures;
a blanking unit including a plurality of blankers and configured to respectively deflect the plurality of charged-particle beams by the plurality of blankers to cause the blanking aperture array to block the respectively deflected plurality of charged-particle beams;
a generating circuit configured to generate a blanking instruction in a serial format; and
a serial transmission cable configured to transmit the blanking instruction generated by the generating circuit to the blanking unit,
wherein the blanking unit is configured to convert the blanking instruction in the serial format, that has been received via the serial transmission cable, into a blanking instruction in a parallel format, and to drive the plurality of blankers based on the blanking instruction in the parallel format.

11. A drawing apparatus for drawing a pattern on a substrate with a plurality of charged-particle beams, the apparatus comprising:
a blanking unit including a plurality of blankers and configured to respectively blank the plurality of charged-particle beams by the plurality of blankers;
a generating circuit configured to generate a blanking instruction in a serial format; and
a serial transmission cable configured to transmit the blanking instruction generated by the generating circuit to the blanking unit,
wherein the blanking unit is configured to convert the blanking instruction in the serial format, that has been received via the serial transmission cable, into a blanking instruction in a parallel format, and to drive the plurality of blankers based on the blanking instruction in the parallel format.

12. The apparatus according to claim 11, wherein the blanking unit includes a redundant circuit with which an element circuit thereof is replaced.

13. The apparatus according to claim 12, wherein the blanking unit further includes a replacement control circuit configured to replace the element circuit with the redundant circuit.

14. The apparatus according to claim 11, wherein the apparatus comprises at least two of the blanking unit arranged in series along paths of the plurality of charged- particle beams, wherein if a blanker in one of the at least two has a defect, a blanker in another of the at least two is used in place of the blanker having the defect.

15. The apparatus according to claim 11, wherein the blanking unit includes
a supporting substrate including a plurality of drivers configured to drive the plurality of blankers, respectively, and
blanking electrodes driven by the plurality of drivers, respectively,
the supporting substrate includes
a semiconductor substrate on which the plurality of drivers are formed, and
a stacked structure, arranged on the semiconductor substrate, of wiring layers
and an interlayer insulation film therebetween,
the blanking electrodes are arranged on the stacked structure, and at least a part of each of the plurality of drivers is arranged under corresponding one of the blanking electrodes.

16. The apparatus according to claim 15, wherein each of the plurality of drivers includes a push-pull circuit.

17. The apparatus according to claim 16, wherein the push-pull circuit includes a CMOS inverter.

18. The apparatus according to claim 15, further comprising a housing surrounding the plurality of blankers, wherein the blanking unit includes a plurality of control signal generating circuits configured to supply control signals to the plurality of drivers, respectively, the supporting substrate extends from an inner space inside of the housing to an outer space outside of the housing, and the plurality of control signal generating circuits are arranged on the supporting substrate in the outer space.

19. The apparatus according to claim 11, wherein
the blanking unit includes a blanking control circuit configured to generate a plurality of driving signals to control the plurality of blankers, respectively, based on the blanking instruction in the parallel format, and
the apparatus further comprises a cooling device configured to cool the blanking control circuit.

20. A method of manufacturing an article, the method comprising:
drawing a pattern on a substrate using a drawing apparatus;
developing the substrate on which the pattern has been drawn; and
processing the developed substrate to manufacture the article,
wherein the drawing apparatus is configured to draw a pattern on the substrate with a plurality of charged-particle beams and comprises:
a blanking unit including a plurality of blankers and configured to respectively blank the plurality of charged-particle beams by the plurality of blankers;
a generating circuit configured to generate a blanking instruction in a serial format; and
a serial transmission cable configured to transmit the blanking instruction generated by the generating circuit to the blanking unit,
wherein the blanking unit is configured to convert the blanking instruction in the serial format, that has been received via the serial transmission cable, into a blanking instruction in a parallel format, and to drive the plurality of blankers based on the blanking instruction in the parallel format.

* * * * *